United States Patent [19]

Guilleminot

[11] Patent Number: 5,045,976

[45] Date of Patent: Sep. 3, 1991

[54] DEVICE FOR MOUNTING A METAL ELEMENT ON A BOARD

[75] Inventor: Pierre Guilleminot, Rambouillet, France

[73] Assignee: U.S. Philips Corporation, New York, N.Y.

[21] Appl. No.: 598,569

[22] Filed: Oct. 15, 1990

Related U.S. Application Data

[63] Continuation of Ser. No. 362,716, Jun. 6, 1989.

[30] Foreign Application Priority Data

Jun. 14, 1988 [FR] France .................... 88 07908

[51] Int. Cl.⁵ .......................................... H05K 7/02
[52] U.S. Cl. ................... 361/417; 361/400; 361/419; 361/420
[58] Field of Search ............. 361/396, 400, 404–406, 361/408, 412, 417, 419, 420, 424; 174/35 R

[56] References Cited

U.S. PATENT DOCUMENTS

| | | | |
|---|---|---|---|
| 4,663,695 | 5/1987 | Ohkawara et al. | 361/405 |
| 4,838,800 | 6/1989 | Lynch | 361/405 |

FOREIGN PATENT DOCUMENTS

| | | | |
|---|---|---|---|
| 0993167 | 5/1965 | Canada | 361/405 |
| 2742716 | 4/1979 | Fed. Rep. of Germany | 361/405 |
| 2404991 | 6/1979 | France | 361/400 |
| 0102166 | 5/1963 | Norway | 361/419 |
| 1224525 | 3/1971 | United Kingdom | 361/404 |

*Primary Examiner*—Gregory D. Thompson
*Attorney, Agent, or Firm*—Norman N. Spain

[57] ABSTRACT

A device for mounting an element (10) on a board (20) which element (10) comprises at least one fixing lug (11) which is to engage in a slot (21) formed in the said board (20). According to the invention, the fixing lug (11) comprises a projection (12) engaging the board (20) inside the slot, and having a thickness which is at least equal to the width (1) of the slot (21). The invention is used to mount housings on printed circuit boards.

3 Claims, 1 Drawing Sheet

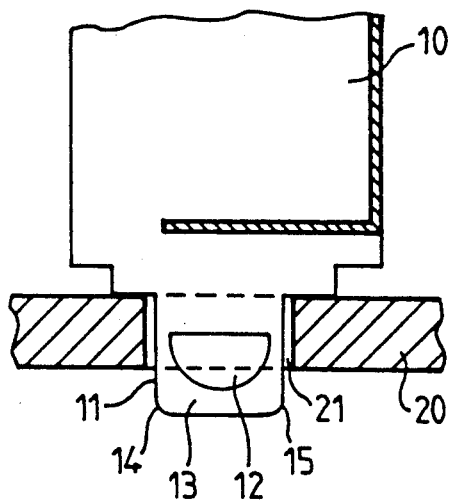
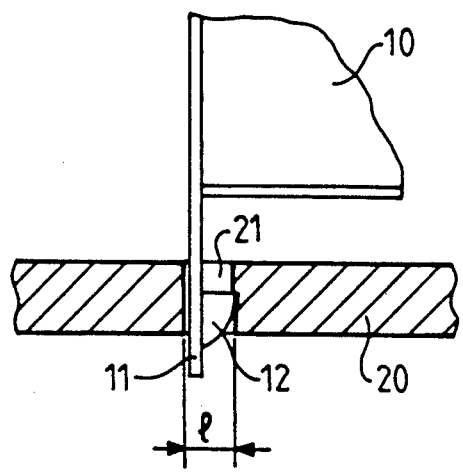
FIG. 1  FIG. 2
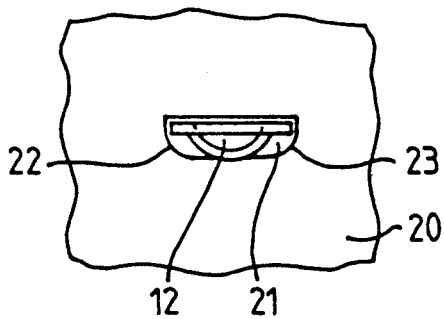
FIG. 3

DEVICE FOR MOUNTING A METAL ELEMENT ON A BOARD

This is a continuation of application Ser. No. 362,716, filed Jun. 6, 1989.

BACKGROUND OF THE INVENTION

This invention relates to a device for mounting an element on a board, said element comprising at least one fixing lug which is to engage in a slot formed in the board.

The invention can be very advantageously used to mount and solder metal elements such as housings or brackets which have to be mounted and soldered on printed circuit boards.

Devices for mounting an element on a board, as described in the opening paragraph, are known from the present state of the art.

The elastic clamping (also termed "snap-in") device requires at least two fixing lugs having a bent end portion which must be passed through the slot. This results in an unsatisfactory fixing lug/slot ratio because the fixing lug is much smaller than the aperture of the slot which results in a poor fixation of the element on the board and, in addition, in a large empty space which must be filled up during soldering, for example wave soldering, and which requires the soldering operation to be repeated several times which leads to a loss of time during assembling and to the copper pads becoming detached from the printed circuit board owing to the use of soldering irons which are too hot.

The device in which mounting is carried out by twisting the end of the fixing lug requires equipment at a fixed work station to carry out this additional time-consuming operation. Moreover, this exhibits a certain aggressiveness relative to the copper pads when the board is a printed circuit board.

Finally, the mounting device comprising sheared lugs has the following disadvantages: a poor fixation, a poor filling-up of the slot owing to the unsatisfactory lug/slot ratio, and a substantial aggressiveness relative to printed circuit boards.

SUMMARY OF THE INVENTION

An object of the present invention consists in providing a device for mounting an element on a board, which element comprises at least one fixing lug which is to engage in a slot formed in the said board, which device allows the elements to be properly fixed onto the board, in particular when the printed circuit boards are placed on a conveyor and when they are wave soldered, and which additionally enables high-quality soldered joints to be obtained, thereby avoiding repetitions of the soldering operation and, hence, loss of time, and which does not require the use of special equipment.

According to the present invention, this object is achieved by fixing lug which comprises a projection engaging the board inside the slot, and which has a thickness which is at least equal to the width of the slot. Thus, the fixation is obtained by positive engagement of the lug over the entire thickness of the board, which ensures an excellant fixation which may be adjusted by varying the thickness of the projection relative to the width of the slot.

By virtue of the improved fixation, the device according to the invention can be used to mount, using only one lug, small elements in areas of the board which are already heavily populated.

By virture of the presence of the projection the fixing lug/slot ratio required is improved considerably. As a result hereof the empty spaces to be filled with solder are much smaller, and consequently, the quality and reproducibility of the soldered joints is improved. The fixing lug/slot ratio may be further improved by decreasing the cross-section of the slot, which can be obtained by providing the said slot with rounded corners at the side where it is engaged by the said projection.

Finally, in order to prevent the conducting pads from becoming detached during the insertion of the fixing lug into the slot of the printed circuit board the free end of the fixing lug is rounded.

The invention will be explained in greater detail by means of non-limitative examples and with reference to the accompanying drawings, in which

BRIEF DESCRIPTION OF THE DRAWING

In the drawing FIG. 1 is a front view of a mounting device according to the invention.

FIG. 2 is a side view of the mounting device of FIG. 1.

FIG. 3 is a bottom view of the mounting device of FIG. 1.

DETAILED DESCRIPTION OF THE INVENTION

The invention will be described in greater detail with reference to the drawing.

FIG. 1, 2 and 3 of the drawing are a front view, side view and bottom view, respectively, of a device for mounting an element 10 on a board 20 which may be a printed circuit board, and the element 10 represents for example, a metal housing accommodating an electric sub-assembly, which is to be mounted and soldered onto the printed circuit board. The element 10 comprises a fixing lug 11 which is to engage in a slot 21 which is formed in the board 20. As is shown in FIGS. 1, 2 and 3, the fixing lug comprises a projection 12 engaging the board 20 inside the slot 21. The thickness of the projection 12 is at least equal to the width 1 of the slot 21. By virtue of the elasticity of the projection the fixing lug will be more fixedly secured in the slot 21 according as the projection 12 has a larger thickness.

In the example shown in FIGS. 1, 2 and 3, the fixing lug 11 is formed with a projection 12 having the shape of a quarter sphere.

In accordance with FIG. 1, the free end 13 of the fixing lug 11 has rounded portions 14, 15. As a result it is prevented that metal conductor tracks become detached from the printed circuit board, as could be the case if the free end 13 had sharp corners.

Finally, in order to further reduce the amount of empty space between the projection 12 and the circumference of the slot 21, the latter is provided with rounded corners 22, 23 at the side where it is engaged by the projection 12. In this manner, the soldered joints between the fixing lug and the metal pads of the board 20, which are situated near the slot 21, can be realised in such manner that they are reproducible and of much better quality.

I claim:

1. An assembly comprising an element (10) provided on a printed circuit board (20) having a slot (21), said element comprising a fixing lug (11) extending from said element and comprising a projection (12) extending from said fixing lug (11) and engaging a side of said slot (21), said projection being quarter sphere shaped and said projection having a thickness at least equal to the width (l) of said slot and minimizing solder containing capacity of said slot.

2. The assembly of claim 1, wherein the free end (13) of said fixing lug (11) has rounded portions (14, 15).

3. The assembly of claim 1, wherein said slot (21) has rounded corners (22, 23) at the side where it is engaged by said projection (12).

* * * * *